United States Patent [19]

Chang

[11] Patent Number: 5,039,875
[45] Date of Patent: Aug. 13, 1991

[54] CMOS POWER-ON RESET CIRCUIT

[75] Inventor: Shuen-Chin Chang, San Jose, Calif.

[73] Assignee: Samsung Semiconductor, San Jose, Calif.

[21] Appl. No.: 441,997

[22] Filed: Nov. 28, 1989

[51] Int. Cl.[5] .................... H03K 17/22; H03K 17/20
[52] U.S. Cl. ................. 307/272.3; 307/594; 307/263
[58] Field of Search .............. 307/272.3, 592, 594, 307/591, 603, 260, 263

[56] References Cited

U.S. PATENT DOCUMENTS

| | | | |
|---|---|---|---|
| 3,895,239 | 7/1975 | Alaspa | 307/594 |
| 4,405,871 | 9/1983 | Buurma et al. | 307/594 |
| 4,591,745 | 5/1986 | Shen | 307/592 |
| 4,818,904 | 4/1989 | Kobayashi | 307/594 |

*Primary Examiner*—Stanley D. Miller
*Assistant Examiner*—Richard Roseen
*Attorney, Agent, or Firm*—Hecker & Harriman

[57] ABSTRACT

A power-on reset circuit. The reset circuit provides an automatic reset pulse immediately after power-up. The supply voltage is provided to the reset circuit. An RC filter with a variable time constant provides a "hump" waveform which is coupled to a waveform shaper. The waveform shaper converts the hump voltage output from the RC filter into a reset signal. Latching mechanisms are included to prevent refiring of the reset signal.

9 Claims, 4 Drawing Sheets

CMOS POWER-ON RESET CIRCUIT

BACKGROUND OF THE PRESENT INVENTION

1. Field of the Invention

This invention relates to the design of reset pulse circuits.

2. Background Art

In complex electrical circuit designs, it is often necessary on power-up to set certain circuit nodes or circuit elements to a known state. For example, when the ON switch is enabled in computer circuits, the computer clocks and other counters need to be initiated, started or reset. Power-on reset circuits are also often required for dynamic random access memory (DRAM) operation. The reset function is most easily accomplished by an automatic pulse which executes immediately after power is turned on. The automatic reset circuit should only act immediately after power-up; accidental firing unnecessarily interrupts the use of the circuit. An effective reset circuit should not inadvertently misfire.

Prior art preset circuits are electronically cumbersome because they use discrete components to achieve these characteristics. The present invention is a device to perform the automatic reset function needed in electrical circuits, which it does with greater device efficiency. It is not dependent on discrete resistive and capacitive components that reside off-chip. The present invention eliminates external power-on circuits, prevents accidental resetting, and is more simple than prior art designs.

Typically, single pulse-type power-on reset signals are required to set critical circuit components to known states during power-on to guarantee the proper operation of a design. It is an object of the present invention to perform this automatic reset function.

It is also an object of the present invention to design an automatic reset signal circuit which self-protects from power source transients and glitches.

It is a further object of the present invention to design the automatic power-up reset signal without using discrete electrical components, i.e., to be an integrated circuit implementable design.

SUMMARY OF THE PRESENT INVENTION

The present invention provides a single pulse reset circuit to set critical circuits to a known state during power-on. This permits proper circuit operation. A supply voltage $V_{cc}$ is supplied to the reset circuit. The supply voltage $V_{cc}$ is not an "instant on" signal, but has a rising edge which ramps up to full amplitude. The reset circuit accepts the supply voltage $V_{cc}$ and provides a single pulse output "PONRST" at the rising edge of $V_{cc}$. The reset circuit of the present invention is implemented in an integrated fashion with no discrete devices required. The reset circuit is less susceptible to unintentional firing due to power source transients or other interferences.

The reset circuit consists of a number of subsystems. An intermediate level reference generator outputs a voltage signal whose level is approximately centered between the supply voltage waveform and 0V. This intermediate level reference voltage is used to control a transistor that functions as a variable resistor in a subsequent circuit block. With this variable resistor, an internal RC filter has a variable time constant. The time constant, along with the resistance, starts at infinity and decreases to measurable values during operation of the circuit. The output of this RC filter is a "hump" waveform, which feeds into the next sequential circuit block, a waveform shaper. The waveform shaper converts the hump voltage output from the RC filter into a signal which mirrors the waveform of the supply voltage for a short interval of time. The waveform shaper is buffered so that it may be connected to other circuits, where the power-on reset pulse is needed. The power-on reset pulse is fed back through feedback lines and enable and latch block to enable the intermediate level reference generator and to disable the RC filter.

DETAILED DESCRIPTION OF THE PRESENT INVENTION

A CMOS power-on reset circuit is described. In the following description, numerous specific details are set forth such as voltage polarity, semi-conductor type, etc., to provide a more thorough understanding of the present invention. It will be obvious however, to one skilled in the art, that the present invention may be practiced without these specific details. In other instances, well-known circuits have not been described so as not to obscure the present invention.

The present invention is a circuit which provides an automatic reset pulse immediately after power-up. The only input to the circuit is the power voltage, $V_{cc}$. The output of the circuit is a signal called PONRST. The reset circuit is comprised of an RC filter with dynamic time constant, a waveform shaper, an enable and latch block, and intermediate-level reference generator. These circuit blocks work sequentially to provide a single reset pulse at start-up.

Start-up is characterized by the supply voltage, $V_{cc}$, rising from 0V in a ramp waveform up to full level, $V_{cc}$. The present invention provides a signal, PONRST, which closely follows the $V_{cc}$ signal while it is in the ramp stage and continues following $V_{cc}$ for a short interval of time after it has reached full voltage. After this interval, PONRST drops to 0V and does not fire again.

Figure 2:
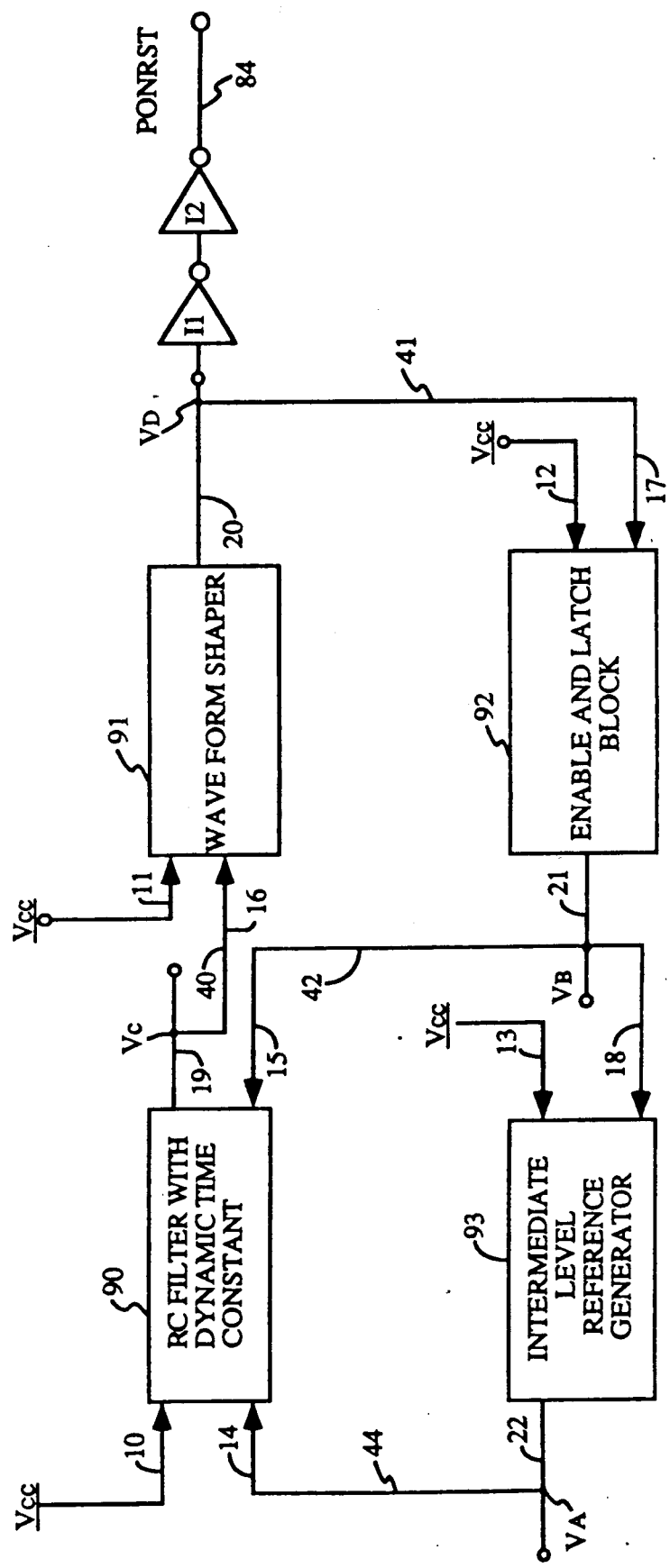
FIG. 2 is a block diagram of the device in FIG. 1.

FIG. 2 is a block diagram of the present invention. $V_{cc}$ is input to all four functional blocks. RC filter 90 receives $V_{cc}$ at input 10, $V_A$ at input 14, and $V_B$ at input 15. RC filter 90 outputs signal $V_C$ at its output 19. Waveform shaper 91 receives as input $V_{cc}$ at input 11, and the signal $V_C$ at input 16. Waveform shaper 91 outputs signal $V_D$ at its output 20. $V_D$ feeds through inverters I1 and I2 to generate the signal PONRST. The effect of inverters I1 and I2 is to buffer the signal power level between the present invention and circuits to which it is attached. $V_D$ feeds into enable and latch block 92 at input 17. Enable and latch block 92 also receives $V_{cc}$ at input 12. Enable and latch block 92 outputs signal $V_B$ on output 21. Intermediate level reference generator 93 receives $V_{cc}$ at input 13, and $V_B$ at input 18. Intermediate level reference generator 93 has output signal $V_A$ on its sole output 22.

RC filter 90 is composed of transistors and capacitors. The transistors operate as switches or variable resistors. RC filter 90 receives as input $V_{cc}$, $V_A$, and $V_B$. RC filter 90 outputs a signal labeled $V_C$. At a functional level, $V_C$, the output of RC filter 90 is dependent upon inputs $V_{cc}$, $V_A$, and $V_B$. At power-up, $V_C$ closely follows the waveform of $V_{cc}$. Subsequently, when $V_A$ or $V_B$ reaches a certain voltage (the turn-on voltage, $V_T$ of RC filter 90 internal transistors), $V_C$ begins to drop to 0V. Going up, $V_C$ is a ramp function because the input signal $V_{cc}$, which $V_C$ follows, is a ramp function. Also, when $V_A$ or $V_B$ goes high, $V_C$, the output of RC filter 90, ramps down.

At power-up, $V_C$, the output of the RC filter 90, closely follows $V_{cc}$ input. The accuracy of signal $V_C$'s approximation of $V_{cc}$ depends upon capacitor internal to RC filter 90. The internal capacitor, along with internal transistors which act as variable resistors, provide RC filter 90 with a variable time constant. During initial power-on, the time constant is almost infinite because internal transistors are set at infinite resistance. During the operation of the circuit, that resistance, and hence the time constant associated with it, drops from infinity toward measurable values. As this happens, the time constant also drops.

Waveform shaper 91 executes its function upon a signal from RC filter 90, signal $V_C$. $V_C$, as mentioned earlier, closely follows $V_{cc}$ out to a certain value. Waveform shaper 91, which receives $V_C$ as an input, turns on its output $V_D$ when $V_C$ reaches a certain level (the turn-on voltage, $V_T$, of transistors internal to the waveform shaper 91). When this turn-on effect occurs, $V_D$ follows $V_{cc}$ even more closely than $V_C$. In fact, $V_D$, after being turned on, is exactly the same value and shape as $V_{cc}$. The output of waveform shaper 91, $V_D$, is dependent on the value of the input $V_C$. When $V_C$ rises beyond a certain voltage, $V_D$ closely follows the other input to waveform shaper 91, $V_{cc}$. Conversely, when $V_C$ drops below that certain value, then signal $V_D$, the output of the waveform shaper 91, is set to 0V.

The output $V_D$ of waveform shaper 91 is an input to enable and latch block 92. The enable and latch block 92 is essentially an inverter and clamp. When $V_D$, the input to this function block is high, the output, $V_B$, goes low and is held low. When $V_D$, the input to block 92 goes low, $V_B$ goes high. $V_B$, the output of the enable and latch block 92, is coupled to the intermediate level reference generator 93 and RC filter 90.

Intermediate level reference generator (ILRG) 93 receives $V_{cc}$ and $V_B$ as input, and has one output, $V_A$, which is one of the inputs to RC filter 90 discussed earlier. ILRG 93 sets its output, $V_A$, dependent on its input, $V_B$. When the input $V_B$ is clamped to 0V, $V_A$ begins ramping up in voltage. The slope of the ramp of $V_A$ is less than the slope of $V_C$, $V_D$, and $V_{cc}$, which are ramp functions as well. When input $V_B$ to ILRG 93 reaches a certain voltage (the turn-on voltage, $V_T$, of transistors in this circuit block) then the output, $V_A$, drops off to 0V very quickly. $V_A$ is unlike signal $V_C$ which ramps up in voltage and then ramps down. $V_A$, although it ramps up, drops off abruptly to 0V.

Figure 3:
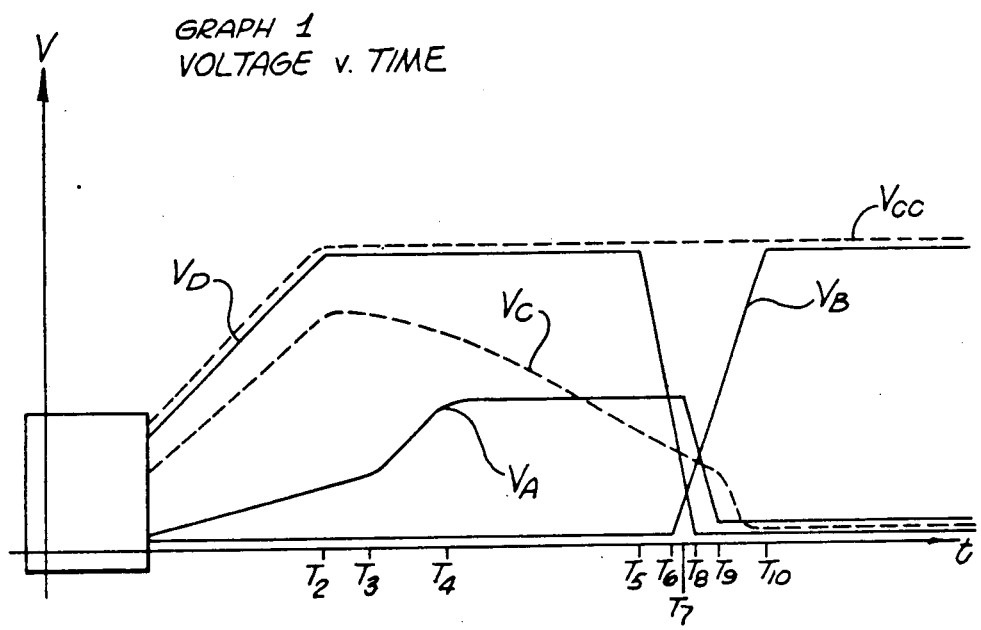
FIG. 3 is a timing diagram for various nodes of the circuit of the present invention.
Figure 4:
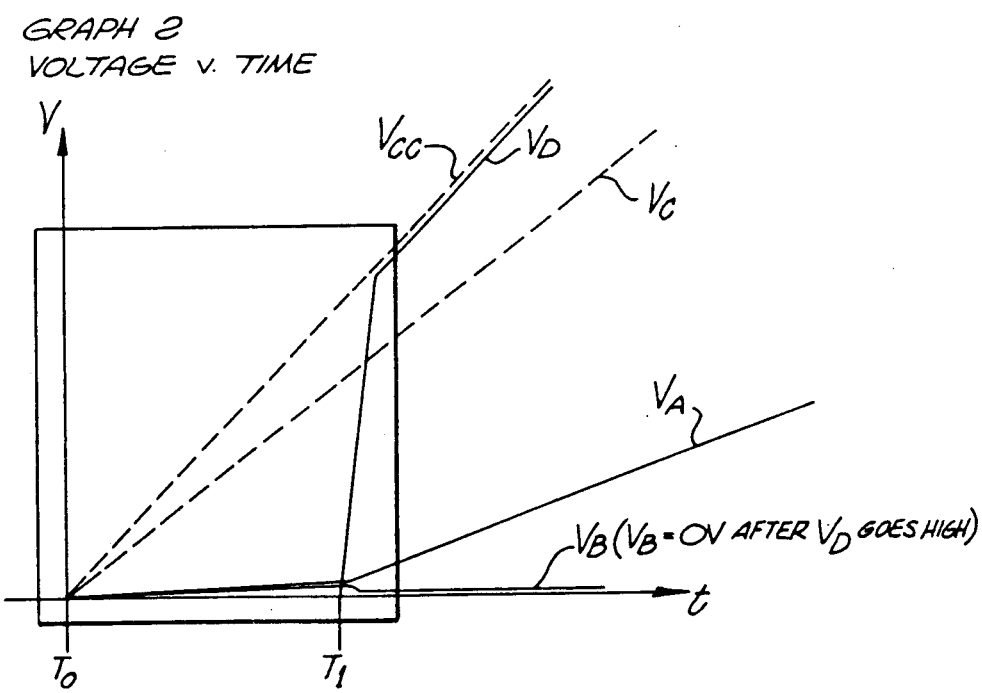
FIG. 4 is a detailed view of the timing diagram of FIG. 3.

The behavior of the various signals of the reset circuit is illustrated in FIGS. 3 and 4. FIG. 3 is a timing diagram of voltage versus time. FIG. 4 is a timing diagram of voltage versus time for the circuit signals at the early stages of operation of the reset circuit.

Referring first to FIG. 4, at time $T_0$, $V_{cc}$ is turned on and begins to ramp up to full voltage. $V_C$ follows $V_{cc}$ very closely and instantaneously at time $T_0$. $V_A$ and $V_B$ each remain low, charging capacitors Q3 and Q17, respectively. $V_D$ is also low immediately after $V_{cc}$ is turned on.

At time $T_1$, $V_C$ has reached a voltage sufficient to turn on transistor Q7 which brings $V_D$ up to approximately the level of $V_{cc}$. At this point, $V_D$ turns on Q15, clamping $V_B$ to 0. With $V_B$ clamped to 0, $V_A$ begins ramping up in voltage, charging capacitor Q3 if $V_{cc}$ is greater than $|VTP(Q1)| + |VTP(Q2)|$.

Referring now to FIG. 3, signals $V_A$, $F_C$, $V_D$ and $V_{cc}$ all continue ramping upward until time $T_2$. At time $T_2$, $V_{cc}$ and $V_D$ reach their peak values and level off. At time $T_3$, the voltage at $V_A$ has reached the threshold voltage of transistor Q5. This causes $V_C$ to begin to discharge slowly through transistor Q5. $V_A$ continues increasing until time $T_4$ when it reaches a peak value, approximately one-half that of $V_{cc}$.

At time $T_5$, $V_C$ falls below the threshold voltage of transistor Q7. This causes $V_D$ to discharge. Accordingly, PONRST falls as well. At time $T_6$, $V_D$ falls below the threshold voltage of transistor Q14, allowing $V_B$ to begin to rise again at time $T_6$. At time $T_7$, voltage $V_B$ has reached a level sufficiently high to latch $V_A$ and $V_C$ to 0 volt through transistors Q19 and Q16, respectively. At this time, transistor Q16 is in the triode region. At time $T_8$, $V_D$ has reached 0 volt. At time $T_9$, $V_A$ has reached its low voltage point. At time $T_{10}$, $V_B$ has risen to approximately $V_{cc}$. As a result, node C is clamped at 0 volt through transistor Q16 regardless of power supply surges which might couple $V_C$ high or low after the initial reset pulse. When $V_B$ is high, the intermediate level reference generator is disabled such that no standby current is generated after the reset function expires.

Figure 5:
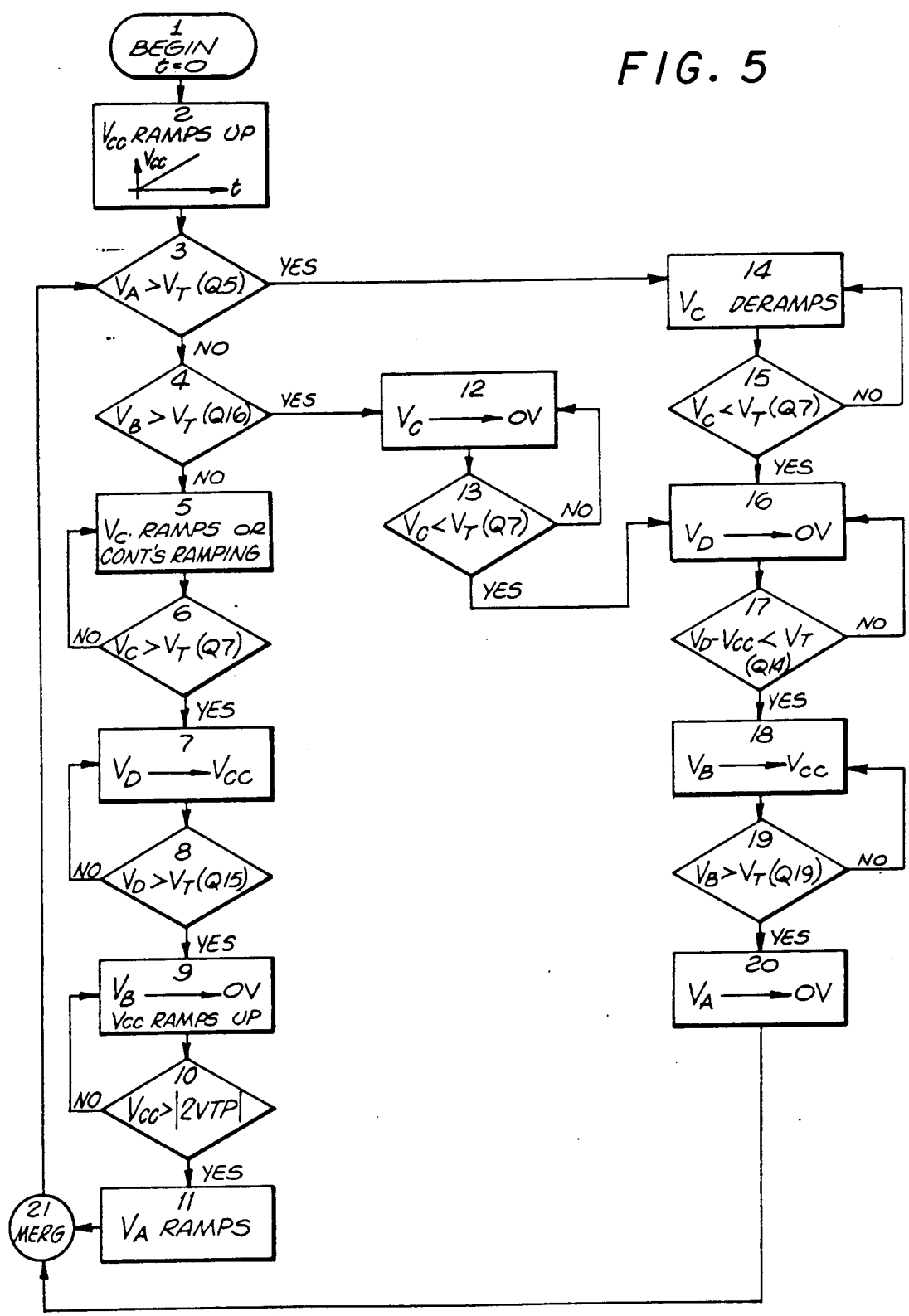
FIG. 5 is a flow diagram of the operation of the present invention.

Referring to FIG. 3, one can see that $V_D$ provides a unitary reset pulse at power-up. This reset pulse closely follows $V_{cc}$, and is very stable after its initial firing. Stability is important because subsequent inadvertent firing of the reset is very disruptive to microprocessor and microprocessor-dependent machines. FIG. 5 is a decisional flow chart of the operation of the present invention. Various internal turn-on voltages are able to execute logic-like functions and enable the circuit to decide when to execute a function or to bypass that function.

In FIG. 5, begin block 1 corresponds to $T=0$. At execution block 2, the power switch has been turned on and $V_{cc}$ begins its ramp function up to full voltage. In decision block 3, there is a check to see if $V_A$ is greater than the turn-on voltage of transistor Q5. In the early stages of this circuit, when $V_{cc}$ has just been turned on, there will be no appreciable voltage at $V_A$, and the function of the circuit flows into decision block 4. Decision block 4 likewise does a voltage level check by comparing $V_B$ to the turn-on voltage of transistor Q16. Again, because voltage is insufficient, this decision will be negative, i.e., $V_B$ will be less than the turn-on voltage of transistor Q16. Next, execution block 5 turns on the ramp function of $V_C$. The chart flows into decision node 6 where it checks to see if $V_C$ has increased above a certain level, a turn-on voltage of Q7. If not, the logic cycles back into execution block 5 where $V_C$ continues ramping. The flow chart cycles between execution block 5 and decision block 6 until the condition in decision block 6 becomes affirmative and the flow continues into execution block 7.

At that point, $V_D$ jumps up to the $V_{cc}$ level. Following execution block 7, decision block 8 checks to see if node $V_D$ voltage is greater than the turn-on voltage of transistor Q15. If not, the flow cycles back to execution block 7 where $V_D$ again is forced toward $V_{cc}$. Finally, when the condition of decision block 8 is satisfied, the circuit continues into execution block 9. The voltage at node $V_B$ is driven toward 0V. In decision block 10, if $V_{cc}$ is not greater than the turn-on voltages of transistors Q1 and Q2, then the circuit returns to execution block 9 and $V_{cc}$ continues ramping up toward its final value. When the condition at decision node 10 is satisfied, then the circuit proceeds to execution block 11 and $V_A$ begins a ramp function. Because as soon as $V_{cc}$ reaches voltage level greater than $|VTP(Q1)|+|VTP(Q2)|$, the ILRG will be activated provided that $V_B$ is lower than $V_{cc}-|VTP(Q18)|$.

From execution block 11, the circuit passes through merge node 21 and returns to decision block 3. Supposing that $V_A$ is still below the turn-on voltage of transistor Q5 (the condition of decision block 3), then the circuit proceeds again through decision block 4. $V_B$ has already been forced to 0V so the decision at block 4 is negative. At execution block 5, $V_C$ continues ramping. At node 6, nothing has changed so that the condition in decision block 6 is still satisfied, i.e., $V_C$ is greater than turn-on of transistor Q7. At execution block 7, $V_D$ is at $V_{cc}$ so the circuit flows through execution block 7 and decision block 8 without pausing. The execution of block 9 and the decision of block 10 are already achieved so that the circuit flows through the states represented by these blocks without hesitating. At execution block 11, $V_A$ continues ramping and the circuit cycles back up to decision block 3.

Now, supposing that $V_A$ is greater than the turn-on voltage of transistor Q5, the circuit proceeds to execution block 14. $V_C$ begins to deramp. In decision block 15, if node $V_C$ is greater than the turn-on voltage of transistor Q7, then the circuit returns to execution block 14 and $V_C$ continues deramping. Once the condition in decision block 15 is satisfied, the circuit proceeds to execution block 16. In that block, $V_D$ is forced to 0V. In decision block 17, there exists a condition that if $V_D-V_{cc}$ is not less than the turn-on voltage of transistor Q14, then the circuit returns to execution block 16 and $V_D$ is again forced to 0V. Once the condition of decision block 17 is satisfied, the circuit continues to execution block 18. In execution block 18, $V_B$ is forced to $V_{cc}$. In decision block 19, if $V_B$ has not yet passed the turn-on voltage of transistor Q19, then the circuit returns to execution block 18. Once the condition in decision block 19 is satisfied, the circuit continues to execution block 20 and $V_A$ is forced to 0V. From execution block 20, the circuit follow through merge node 21 and back to decision block 3.

$V_A$, which has just been forced toward 0V, may still satisfy the condition of decision block 3. Therefore, the circuit will again cycle to execution block 14, and $V_C$ will continue deramping. Circuit function flows into decision block 15, whose condition was satisfied in the previous pass. The circuit advances to execution block 16 which has already been executed, and node 17 whose condition also has been satisfied. The circuit continues to execution block 18 which has already been executed, and whose condition, contained in decision block 19, has also been satisfied. The circuit continues again to execution block 20 and $V_A$ is continued to be forced to 0V. The circuit flows again through merge node 21 and back to decision block 3.

Supposing now that $V_A$, forced to 0V in execution block 20, is below the turn-on voltage of transistor Q5, the circuit continues downward into decision block 4. Unlike the first pass through this decision block, $V_B$ is now at $V_{cc}$ level (look back to execution block 18). Therefore, the circuit state flows into execution block 12 and $V_C$ is forced to 0V. The circuit state then flows to decision block 13 and if $V_C$ is not below the turn-on voltage of transistor Q7, then $V_C$ is forced to 0V again. When the condition at decision block 13 is satisfied, i.e., $V_C$ is less than the turn-on voltage of transistor Q7, then the circuit flows back into execution block 16. $V_D$ is again clamped to 0V. By the action of execution block 16, the condition in decision block 17 is satisfied and the circuit flows again to decision block 18, where $V_B$ is clamped to $V_{cc}$ level. By the action of execution block 18, the condition of decision block 19 is satisfied and the circuit flows into execution block 20. In execution block 20, $V_A$ is again clamped to 0V.

The final state of the circuit can be traced through a path of the logic flow diagram, through which the circuit in its final state cycles. The circuit begins at decision node 3, because $V_A$ is now clamped at 0V, and the circuit flows to decision node 4. Because $V_B$ is now at $V_{cc}$ level, the circuit flows through execution block 12 and decision block 13. Because $V_C$ is clamped at 0V, the circuit flows through these blocks without hesitation. Similarly, because $V_D$ is already at 0V, the circuit flows through execution block 16 and decision block 17 without pausing. $V_B$ is already at $V_{cc}$ level. Therefore, execution block 18 and decision block 19 are sped through. Finally, because $V_A$ is at 0V, there is no need to execute the function of execution block 20. The circuit finds its final state by continually cycling through these blocks: 3,4,12,13,16,17,18,19,20 and 21, and then back to 3. This is a stable state because none of the execution blocks or decision blocks will now effect any change in the operation.

Figure 1:
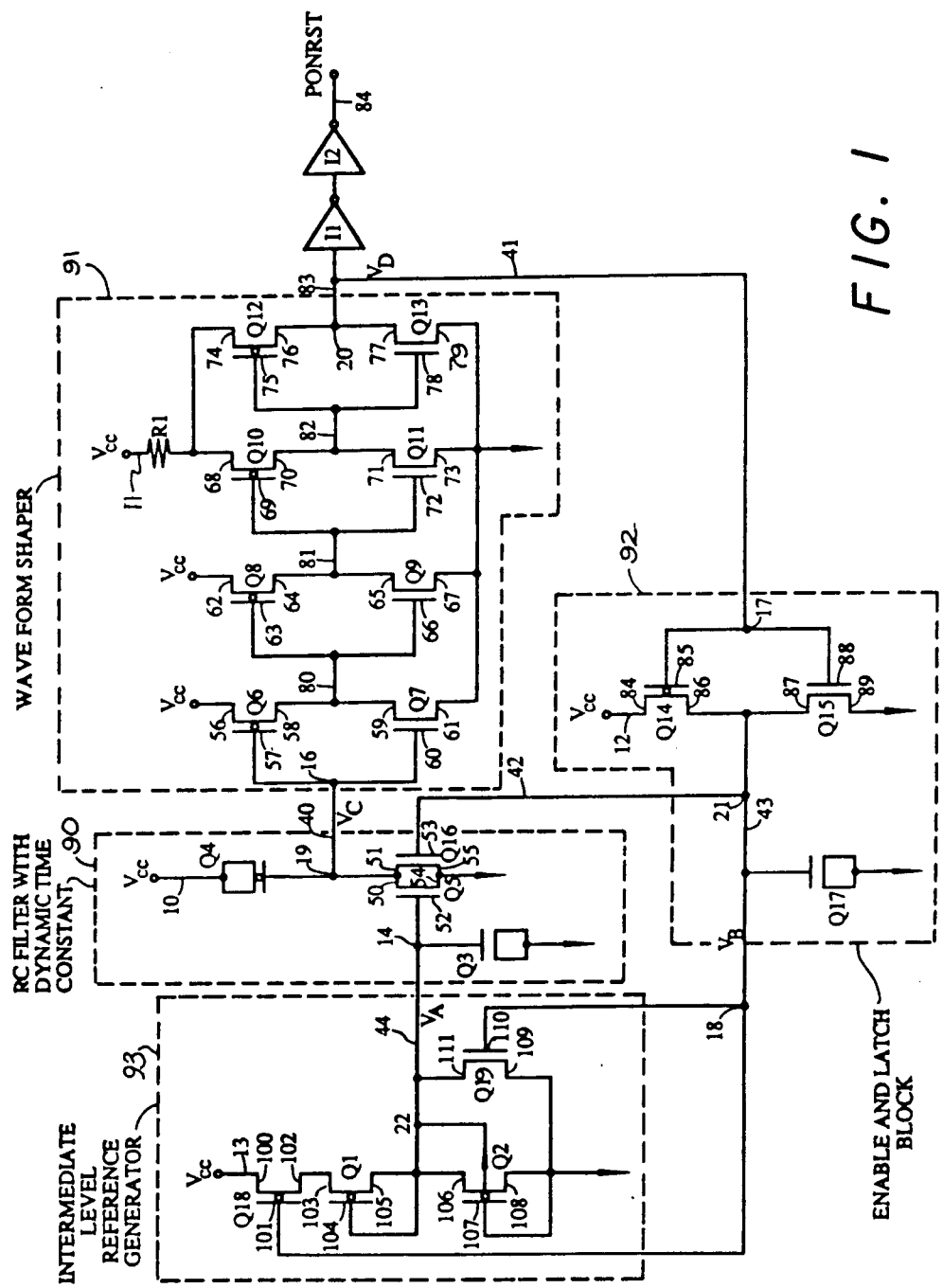
FIG. 1 is a schematic representation of the present invention.

FIG. 1 is an electrical schematic of the present invention. It illustrates N-Channel and P-channel field-effect transistors, integrated circuit capacitors, resistors, and inverters. FIG. 1 divides the circuit into the component subcircuits.

RC filter 90 comprises P-channel capacitor Q4, N-channel capacitor Q3, and N-channel transistors Q5 and Q16. Capacitor Q4 is connected between $V_{cc}$ input 10 and output node 19 of RC filter 90. Capacitor Q3 is connected between input node 14 of RC filter 90 and ground. Transistors Q5 and Q16 are parallel connected, drain-drain and source-source, between output node 19 of RC filter 90 and ground. Drain 50 of transistor Q5 is connected to drain 51 of transistor Q16 which is connected to output node 19. Gate 52 of transistor Q5 is connected to input node 14. Gate 53 of transistor Q16 functions as input 15 to RC filter 90. Source 54 of transistor Q5 and source 55 of transistor Q16 are common-connected to ground. Output node 19 is connected to interconnect line 40, which transmits the output signal of RC filter 90 to the waveform shaper 91. Input node 14 is connected to line 44, from which it receives an input signal, $V_A$, to RC filter 90. Gate 53 of transistor Q16, which performs the function of input 15 for RC filter 90, is connected to line 42, on which it receives input signal $V_B$ from enable and latch block 92.

Line 40, the carrier of $V_C$, connects output 19 of RC filter 90 to input 16 of waveform shaper 91. Waveform shaper 91 consists of complementary transistor pairs Q6-Q7, Q8-Q9, Q10-Q11 and Q12-Q13. Q6, Q8, Q10 and Q12 are P-channel transistors and Q7, Q9, Q11 and Q13 are N-channel transistors. The complementary pairs have particular width-to-length (W/L) ratios.

The W/L ratios for these transistors are as follows:
Q6/Q7 is approximately 1:5
Q8/Q9 is approximately 15:1
Q10/Q11 is approximately 1:5
Q12/Q13 is approximately 2.5:1

Sources 61, 67, 73 and 79 of transistors Q7, Q9, Q11 and Q13, respectively, are common-connected to ground. Sources 56 and 62 of transistors Q6 and Q8, respectively, plus a terminal of resistor R1, function as input 11 of waveform shaper 91 which receives the waveform of $V_{cc}$. The other end of resistor R1 is connected to sources 68 and 74 of transistors Q10 and Q12, respectively. Input node 16 of waveform shaper 91, which receives signal $V_C$ on line 40, is connected to gates 57 and 60 of transistors Q6 and Q7, respectively. Drains 58 and 59 of transistors Q6 and Q7, are connected through line 80 to gates 63 and 66 of transistors Q8 and Q9, respectively. Drains 64 and 65 of transistors Q8 and Q9, respectively, are connected through line 81 to gates 69 and 72 of transistors Q10 and Q11, respectively. Drains 70 and 71 of transistors Q10 and Q11, respectively, are connected through line 82 to gates 75 and 78 of transistors Q12 and Q13, respectively. Drains 76 and 77 of transistors Q12 and Q13, respectively, are connected through line 83 to output node 20. $V_D$, the signal on output line 83 and output node 20, feeds into inverters I1 and I2 connected in series. Output line 84 transmits the power-on reset signal, PONRST. Output node 20 is connected to line 41 which carries the signal $V_D$ to enable and latch block 92 at its input 17.

Enable and latch block 92 consists of P-channel transistor Q14, N-channel transistor Q15 and N-channel capacitor Q17. Transistors Q14 and Q15 form a complementary pair where the W/L of transistor Q14 is very small compared with the W/L of Q15. Input line 41 is received at input 17 of enable and latch block 92. Input node 17 is connected to gates 85 and 88 of transistors Q14 and Q15, respectively. Source 84 or transistor Q14 is connected to input 12 of enable and latch block 92 where is received the waveform of $V_{cc}$. Source 89 of transistor Q15 is connected to ground. Drains 86 and 87 of transistors Q14 and Q15, respectively, are connected together. They are also attached via line 43 to output 21 of enable and latch block 92. Capacitor Q17 shunts line 43 to ground. Output node 21 is connected to ground through capacitor Q17. The signal on output 21, $V_B$, is connected to RC filter 90 at input 15 via line 42. $V_B$ also connects to input 18 of intermediate level reference generator 93 via line 43.

Intermediate level reference generator (ILRG) 93 receives the signal on line 43 from enable and latch block 92 at its input 18. ILRG 93 also receives $V_{cc}$ waveform on input 13. ILRG 93 is composed of three P-channel transistors Q18, Q1 and Q2, and a single N-channel transistor, Q19. Input 18 is connected to gate 110 of transistor Q19 and to gate 101 of transistor Q18. Source 100 of transistor Q18 is connected to input 13. Drain 102 of transistor Q18 connects to source 103 of transistor Q1. Gate 104 of transistor Q1 connects to node 112. Drain 105 of transistor Q1 also connects to node 112. Source 106 of transistor Q2 also connects to node 112. Node 112 connects to output 22 via line 44. N-well of transistor Q2 connects to node 112. Gate 107 of transistor Q2 connects to ground. Drain 108 of transistor Q2 also connects to ground. Drain 109 of transistor Q19 connects to output 22. Gate 110 of transistor Q19 connects to input 18. Source 111 of transistor Q19 connects to ground. Output signal $V_A$ is to be found at output 22 and transmitted via line 44 to RC filter 90.

At power-on, capacitor Q4 and transistor Q5 function as a filter, (RC filter 90). The time constant is almost infinite at power-up because at node 14, the gate of transistor Q5, there is very little voltage and so Q5 is an almost-infinite resistance. For this reason, $V_C$ on line 40 closely follows via capacitor Q4 the waveform of $V_{cc}$.

Waveform shaper 91 is composed of transistors Q6-Q13, resistor R1, and inverters I1 and I2. Inverters I1 and I2 are buffers for the circuits that are to be reset. The P-channel and N-channel ratios of waveform shaper 91 (Q6-Q13) and enable and latch block 92, (Q14-Q17), are designed such that when $V_C$ reaches $V_T$ of Q7 (remember, $V_C$ is closely following $V_{cc}$, a ramp function), $V_D$ at node 20 and line 41 will quickly jump up and follow $V_{cc}$. This will, in turn, set $V_B$ at node 21 and lines 42 and 43 to 0V, and disable Q16 and Q19. 0V on line 43 turns on Q18 to enable intermediate level reference generator 91 (Q1 and Q2) during the very beginning of power-on. When Q18 is turned on, Q1 and Q2 will form a voltage divider to set $V_A$ on line 44 at about 60% of $V_{cc}$ to guarantee low $V_{cc}$ functionality at high $V_T$ process corner.

Q3 is a capacitor between line 44 and ground which controls the ramping rate of $V_A$. When $V_B$ is set to 0V, $V_A$ begins ramping up in voltage.

As soon as $V_A$ on line 44 reaches $V_T$ of Q5, $V_C$ starts to discharge slowly through Q5. Now RC filter 90, composed of Q4 and Q5, has a time constant which is decreasing from infinity. $V_A$ on line 44 continues increasing in voltage until Q5 is forced into a triode mode and $V_C$ on line 40 is effectively clamped to ground (time constant=0). The end result is a "hump" waveform $V_C$ created on line 40 during power-on. Resistor $R_1$ in FIG. 1 serves as a current limiter to minimize the switching current during power-on. Q17 is used to hold $V_B$ at almost 0V at the very beginning of power-on.

Before $V_A$ reaches $V_T$ of Q5, $V_C$ essentially follows $V_{cc}$ and the voltage level of $V_C$ on line 40 during this period of time is determined by the coupling efficiency of P-channel capacitor Q4. After $V_A$ reaches $V_T$ of Q5, the voltage $V_C$ on line 40 starts to fall slowly. As soon as $V_C$ falls below $V_T$ of Q7, $V_D$ and the output signal PONRST, will go low and force $V_B$ to high via Q14. This will also latch $V_A$ and $V_C$ at 0V through Q19 and Q16, respectively. At this moment, Q16, connected on line 42 to $V_B$, is in a triode region. $V_C$ will be clamped at 0V through Q16 regardless of any power supply surges which might couple $V_C$ on line 40 high or low.

Also, when $V_B$ is at $V_{cc}$, intermediate level reference generator 93 will be disabled such that no standby current is drawn after the reset function expires. This is the implementation of the no-power characteristic of this device.

In summary, the waveform shaper 91 converts the hump waveform of $V_C$ into a single-pulse signal PONRST with full $V_{cc}$ swing during power-on. $V_B$ serves as the enable and latch signal through the proper control of Q16, Q18 and Q19 to enable the power-on reset generator and to avoid accidental reset due to power surges. All of these operations are self-timed. No external timing control is required. The minimum reset pulse width is achieved by modulating the turn-on resistance of Q5 to obtain the dynamic RC time constant through intermediate level reference generator 93.

Thus, a power-on reset circuit has been described.

I claim:

1. A circuit for providing a reset pulse comprising:
   receiving means for receiving a supply voltage and providing a first output;
   latching means coupled to said supply voltage, said latching means providing a second output, said second output coupled to said receiving means;
   filter means coupled to said first output, said second output, and said supply voltage, said filter means providing a third output;
   wave shaping means coupled to said supply voltage and said third output, said wave shaping means providing said reset pulse, said reset pulse coupled to said latching means.

2. The circuit of claim 1 wherein said receiving means comprises an intermediate level reference generator.

3. The circuit of claim 1 wherein said latching means is used to prevent unintentional occurrence of said reset pulse.

4. The circuit of claim 2, wherein said intermediate level reference generator comprises three field-effect transistors (FETs) of a first type, and one FET of a second type, where:
   said three FETs of said first type are connected in series;
   said FET of said second type is connected in parallel with one of said three series-connected FETs;
   one of said FETs of said first type enables said intermediate level reference generator when said second output falls below a first voltage level;
   said FET of said second type disables said intermediate level reference generator when said second output exceeds a second voltage level.

5. The circuit of claim 1, wherein said filter means comprises an RC filter comprising two FETs of said second type, a capacitor of a first type and a capacitor of a second type, where:
   said FETs are connected in parallel;
   said capacitor of said second type is connected in parallel between said first output and a low voltage level;
   said capacitor of said first type is connected in series between said supply voltage and drains of said FETs connected in parallel;
   one of said FETs receiving at a gate said first output;
   one of said FETs receiving at a gate said second output.

6. The circuit of claim 1, wherein said wave shaping means comprises four complementary pairs of FET's, where:
   said complementary pairs comprise a FET of said first type connected in series with a FET of said second type;
   said complementary pairs provide a first complementary pair output, a second complementary pair output, a third complementary pair output and a fourth complementary pair output, respectively;
   said complementary pairs are connected in parallel between said supply voltage and a low voltage level;
   said third output of the filter is connected to gates of a first of said complementary pairs, said first complementary pair output connected to gates of a second of said complementary pairs, said second complementary pair output connected to gates of a third of said complementary pairs, said third complementary pair output connected to the gates of a fourth of said complementary pairs, said fourth complementary pair output providing said reset pulse;
   said reset pulse set at said low voltage level when said third output is below a first voltage level;
   said reset pulse is approximately equal to said supply voltage when said third output is above said first voltage level.

7. The circuit of claim 3, wherein said latching means comprise a FET of said first type, a FET of said second type and a capacitor of said second type, where:
   said FET's are connected in series between said supply voltage and a low voltage level;
   said capacitor is connected to drains of said FET's;
   said reset pulse is coupled to gates of said FET's;
   drains of said FET's providing said second output;
   said second output is at said low voltage level when said reset pulse is above a first voltage level;
   said second output of said latching means matches said first output when said input received from said wave shaping means is below said first voltage level.

8. The circuit of claim 6, wherein two of said series complementary pairs are connected through a resistor to said supply voltage.

9. The circuit of claim 6, wherein said reset pulse is connected to a first and second inverter.

* * * * *